US006281817B2

(12) United States Patent
Bengio et al.

(10) Patent No.: US 6,281,817 B2
(45) Date of Patent: Aug. 28, 2001

(54) Z-CODER: A FAST ADAPTIVE BINARY ARITHMETIC CODER

(75) Inventors: Yoshua Bengio, Montreal (CA); Leon Bottou, Highlands; Paul G. Howard, Morganville, both of NJ (US)

(73) Assignee: AT&T Corp., New York, NY (US)

( * ) Notice: Subject to any disclaimer, the term of this patent is extended or adjusted under 35 U.S.C. 154(b) by 0 days.

(21) Appl. No.: 09/795,395

(22) Filed: Feb. 28, 2001

Related U.S. Application Data

(63) Continuation of application No. 09/042,007, filed on Mar. 13, 1998.
(60) Provisional application No. 60/054,495, filed on Jul. 31, 1997.

(51) Int. Cl.[7] .............................. K03M 9/00; K03M 7/34
(52) U.S. Cl. .............................................. 341/107; 341/51
(58) Field of Search ................................ 341/107, 51, 50, 341/106; 382/232, 233, 247; 702/181

(56) References Cited

U.S. PATENT DOCUMENTS

| Re. 35,781 | * | 5/1998 | Ono et al. ............................... 341/51 |
| 4,933,883 | * | 6/1990 | Pennebaker et al. ................. 702/181 |
| 4,935,882 | | 6/1990 | Pennebaker et al. . |
| 5,059,976 | | 10/1991 | Ono et al. . |
| 5,307,062 | | 4/1994 | Ono et al. . |
| 5,781,136 | * | 7/1998 | Imanaka et al. ...................... 341/107 |
| 5,859,604 | * | 1/1999 | Slattery et al. ....................... 341/107 |

FOREIGN PATENT DOCUMENTS

| 1291820 | 11/1991 | (CA) . |
| 1291821 | 11/1991 | (CA) . |
| 1292070 | 11/1991 | (CA) . |
| 2008943 | 4/1995 | (CA) . |

OTHER PUBLICATIONS

Paul G. Howard, Jeffrey Scott Vitter, Arithmetic Coding for Data Compression, Proceedings of the IEEE, vol. 82, No. 6, Jun. 1994.

Ono et al, "Bi–Level Image Coding with Melcode—Comparison of Block Type Code and Arithmetic Type Code—", Communication Systems Development Lab., Mitsubishi Electric Corp., CH2682–3/89/0000–0255 1989 IEEE.

Langdon, Jr. "An Introduction to Arithmetic Coding", IBM Journal of Research and Development, U.S., IBM Corp., Armonk, vol. 28, No. 2, pp. 135–149.

(List continued on next page.)

*Primary Examiner*—Patrick Wamsley
(74) *Attorney, Agent, or Firm*—Kenyon & Kenyon

(57) ABSTRACT

A binary arithmetic coder and decoder provides improved coding accuracy due to improved probability estimation and adaptation. They also provide improved decoding speed through a "fast path" design wherein decoding of a most probable symbol requires few computational steps. Coded data represents data that is populated by more probable symbols ("MPS") and less probable symbols ("LPS"). In an embodiment, a decoder receives a segment of the coded data as a binary fraction C. It defines a coding interval of possible values of C, the interval extending from a variable lower bound A to a constant upper bound 1. For each position in the decoded symbol string, the decoder computes a test value Z that subdivides the coding interval into sub-intervals according to the relative probabilities that an MPS or an LPS occurs in the position. A first sub-interval extends from the lower bound A to the test value Z; the second sub-interval extending from the test value Z to 1. If C is greater than Z, the decoder emits an MPS for the current position in the decoded symbol string and sets the lower bound A to the test variable Z for use during decoding of the next position in the decoded symbol string. If C is less than Z, the decoder emits an LPS and computes a new lower bound A and a new binary fraction C for use during decoding of the next position in the decoded symbol string. The encoder operates according to analogous techniques to compose coded data from original data.

52 Claims, 5 Drawing Sheets

OTHER PUBLICATIONS

Mitchell et al, "Software Implementations of the Q–Coder", IBM Journal of Research and Development, U.S., IBM Corp., Armonk, vol. 32, No. 6, pp. 753–774.

"Speed–Up Mode" for Q–Coder Software Implementation, IBM Technical Bulletin, U.S. IBM Corp., New York, vol. 32, No. 8B, pp. 17–20.

* cited by examiner

Z-CODER: A FAST ADAPTIVE BINARY ARITHMETIC CODER

This Application is a con't of Ser. No. 09/042,007 filed Mar. 13, 1998 which claims benefit of Prov. No. 60/054,495 filed Jul. 31, 1997.

BACKGROUND OF THE INVENTION

1. Field of the Invention

The present invention relates to an improved adaptive binary arithmetic coder that provides improved processing speed and accuracy over conventional arithmetic coders.

2. Related Art

Arithmetic coders provide well-known algorithms for encoding data. Compression ratios of the arithmetic coders can reach the information theory limit. The arithmetic coder and decoder must possess good estimates of the probability distribution of each symbol to code. For each symbol to be coded in a string element, the encoder and decoder must possess a table containing estimated probabilities for the occurrence of each possible symbol at each point in the symbol string. The coders themselves must perform a table search and at least one multiplication. For this reason, arithmetic coders incur high computational expense. Binary adaptive arithmetic coders, such as the "Q-Coder," by Pennebaker, et al. (1998) and the "QM-Coder," by Ono (1993), have been developed to overcome this drawback.

A high-level system diagram of a prior art binary arithmetic coder is shown in FIG. 1. Data to be coded is input to an encoder 100. The encoder 100 encodes the data and outputs a string of coded data to a channel 200. A decoder 300 retrieves the code string from the channel 200 and replicates the original data by decoding the coded data.

The coding process often is described by the operation of the decoder 300. In the decoder, the code string is interpreted as a binary representation of a real number contained in the unit interval [0,1[. The binary arithmetic coder divides the unit interval into two sub-intervals having lengths that are proportional to the estimated probabilities of each value of the first bit in the symbol string. Any code string located in a first, lower sub-interval represents a symbol string starting with a zero (0). Conversely, any code string located in the upper sub-interval represents a symbol string starting with a one (1).

Each of the sub-intervals can be divided into two smaller sub-intervals having lengths that are proportional to the estimated conditional probabilities of the second symbol bit given the previously encoded symbol bit. Any code string located in one of these sub-intervals represents a symbol string starting with the corresponding two bit prefix.

The decoding process is repeated. Sub-intervals are themselves divided into smaller sub-intervals representing probabilities of the value of the next bit in the symbol string. The process produces a partition of the unit interval having sub-intervals that correspond to each possible value of the symbol string. Any code string in the interval can be chosen corresponding to the encoded symbol string.

According to theory, when an interval is divided into sub-intervals, the length of each sub-interval should be proportional to the probability of the value of the next data symbol to be decoded given the previous symbol bits. The probability distribution of the code string therefore would be uniform in the interval. Since each code bit is equally likely to be a 0 or a 1, it would carry as much information as information theory allows. In other words, the coder would achieve entropic compression.

The known Q-Coder and QM-Coder, while they represent advances over traditional arithmetic coders, do not provide performance that approaches entropic compression. Thus, there is a need in the art for a binary arithmetic coder that provides improved compression ratios than the Q-Code and the QM-Coder.

Decoding speed is an important performance characteristic of data coding systems. Decoding latency, the time that is required to generate decoded data once the coded data is received should be minimized wherever possible. Thus, decoders that introduce lengthy or complex computational processes to the decoding operation are disfavored. Accordingly, there is a need in the art for a data decoding scheme that is computationally simple and provides improved throughput of decoded data.

SUMMARY OF THE INVENTION

The present invention provides a binary arithmetic coder and decoder having important advantages over the prior art. The coding scheme provides improved coding accuracy over the prior art due to improved probability estimation and adaptation. It provides improved decoding speed through a "fast path" design wherein decoding of a most probable symbol requires few computational steps.

According to the present invention, coded data represents data that is populated by more probable symbols ("MPS") and less probable symbols ("LPS"). In an embodiment, the decoder receives a segment of the coded data as a binary fraction C. It defines a coding interval of possible values of C, the interval extending from a variable lower bound A to a constant upper bound 1. For each position in the decoded symbol string, the decoder computes a test value Z that subdivides the coding interval into sub-intervals according to the relative probabilities that an MPS or an LPS occurs in the position. A first sub-interval extends from the lower bound A to the test value Z; the second sub-interval extending from the test value Z to 1. If C is greater than Z, the decoder emits an MPS for the current position in the decoded symbol string and sets the lower bound A to the test variable Z for use during decoding of the next position in the decoded symbol string. If C is less than Z, the decoder emits an LPS and computes a new lower bound A and a new binary fraction C for use during decoding of the next position in the decoded symbol string. The encoder operates according to analogous techniques to compose coded data from original data.

DETAILED DESCRIPTION

The present invention provides a data coding system, labeled the "Z-Coder," that provides improved compression ratios over traditional binary arithmetic coders. The decoder of the Z-Coder system may be optimized to provide very fast decoding of coded data.

Figure 1:
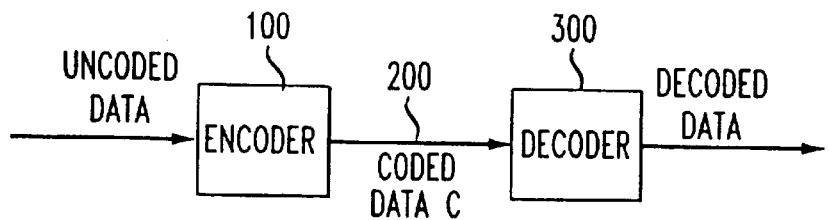
FIG. 1 is a high-level system block diagram of a known binary arithmetic coder.
Figure 2:
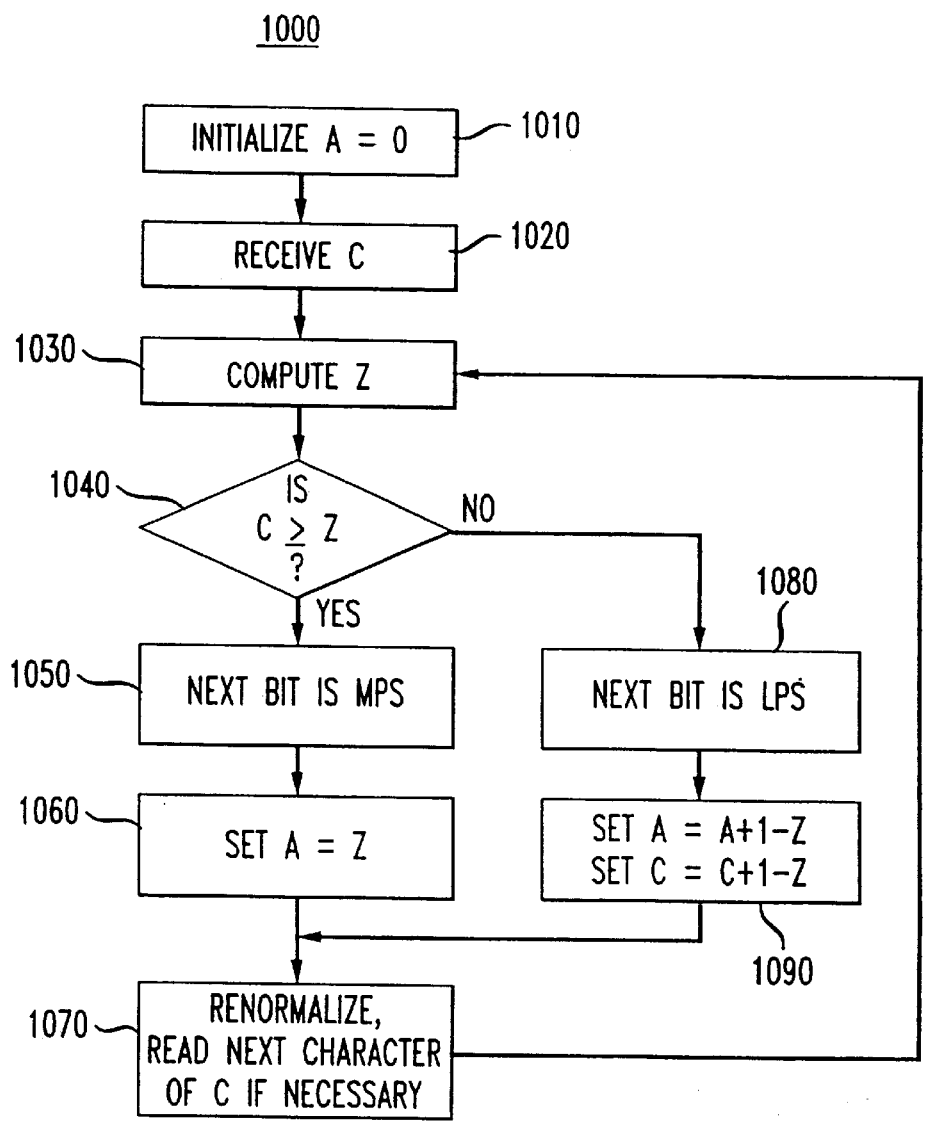
FIG. 2 illustrates a method of operation of a decoder according to a first embodiment of the present invention.

To facilitate an understanding of the invention, the decoding scheme of the present invention is described first. A method of operation 1000 of a decoder according to a first embodiment of the present invention is shown in FIG. 2. The decoder decodes a coded data string, labeled "C(t)," into decoded data. The decoded data is a string of symbols that may be either a most probable symbol ("MPS") or a least probable symbol ("LPS"). C(t) is treated by the decoder as a binary fraction. For example, a coded data string "1010101011111111" is treated as "0.1010101011111111".

When C(t) is received and before the decoder tests its value, C(t) may take any value between 0 and 1 (C(t)∈[0,1[). The decoder maintains a second variable, labeled "A(t)," that represents a lower bound of possible values of C(t). Thus, the decoder sets A(1)=0 as an initial step (Step 1010) and further sets C(1) to a code string received from the channel (Step 1020).

Decoding of the $t^{th}$ code symbol operates according to steps 1030–1080. At step 1030, the decoder computes a test variable, labeled "Z(t)", that divides the interval [A(t), 1[ in proportion to the relative probabilities of MPS and LPS (Step 1030). The decoder compares the actual value of C(t) against the test variable Z(t) to determine which is greater (Step 1040). If C(t) is greater than Z(t), the decoder determines that the next symbol to be decoded is a MPS (Step 1050). The decoder sets A(t+1)=Z(t), because Z(t) is established as the lower bound of C(t) (Step 1060).

However, if C(t) is less than Z(t), the next bit to be decoded is the LPS (Step 1070). When a least probable symbol occurs, C(t) falls between A(t) and Z(t). To prepare for the next decoding iteration, C(t+1) should be bounded by A(t+1) and 1. Accordingly, the decoder shifts the values of A(t) and C(t) in an amount sufficient to shift Z(t) to 1, the higher bound of C(t) (Step 1080). A(t+1)=A(t)+1−Z(t) and C(t+1)=C(t)+1−Z(t).

After step 1060 or step 1080, the decoder may re-normalize the variables A(t) and C(t) (Step 1070). Re-normalization occurs when the most significant bit positions of C(t) and of A(t) are equal to one. When this occurs, the most significant bit position provides no more useful information to the decoding of data. The most significant bit position is "consumed" by the decoding process.

The decoder of the present invention may be implemented in a microprocessor or a digital signal processor. In such an implementation, values of A(t) and C(t) are stored in data registers having a fixed length, such as 16 bit registers. Renormalization causes a shift of data in each register one bit position to the left. It shifts the most significant bit out of A(t) and C(t). The shift of data in the register storing C(t) permits a new bit to be retrieved from the channel and stored in the least significant position in the register.

Because A(t) is always less than or equal to C(t), it is necessary to test only the first bit position of A(t). If that bit position is a one (1), then the decoder determines that renormalization shift should be performed.

The method of FIG. 2 works so long as both the encoder and the decoder use the same test values Z(t) for testing and adjusting the lower bound of register A(t).

The Z-Coder provides compression ratios that approach entropic compression ratios. It provides a closer approximation of entropic compression than prior art coders. Entropic compression is achieved when Z(t) splits the interval [A(t),1[ precisely in proportion with the probabilities $P_{LPS}$ and $P_{MPS}$. For entropic compression:

$$Z_e(t)=1-(1-P_{LPS})(1-A(t))=A(t)+P_{LPS}(1-A(t))$$

Figure 3:
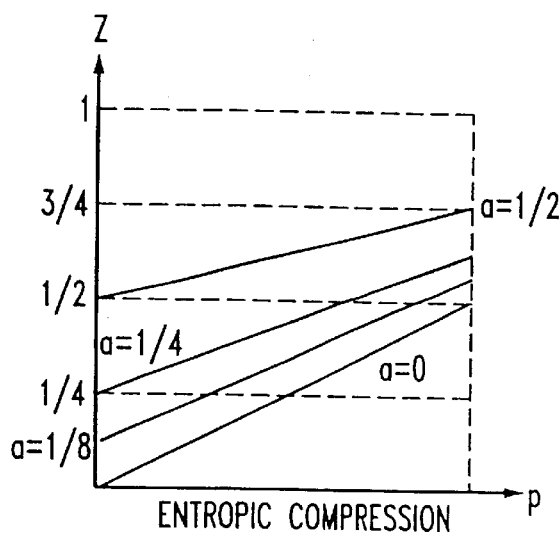
FIGS. 3 and 4 respectively illustrate interval parameters as a function of interval splitting variables in an entropic coding application and a QM Coder of the prior art.
Figure 4:
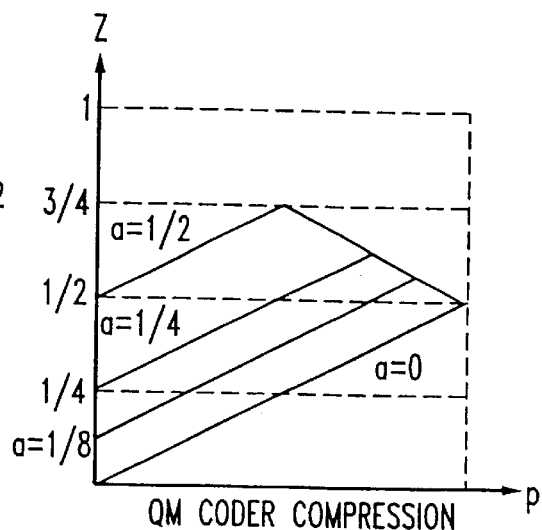

Unfortunately, calculation of a test value that achieves entropic compression would require a multiplication to be performed, a computationally slow operation. FIG. 3 illustrates lines representing the test value Z(t) as a function of $P_{LPS}$ for several values of A(t) under entropic conditions. The multiplication arises because each line has a different slope. FIG. 4 illustrates an approximation used by the QM-Coder implemented to avoid the slow multiplications. The QM-Coder deviates significantly from entropic compression.

Figure 5:
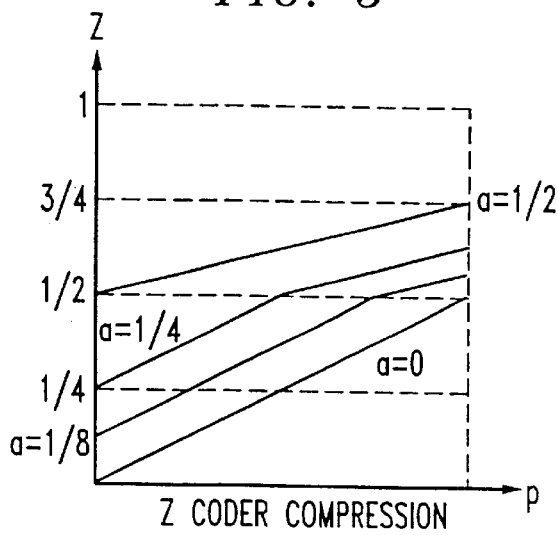
FIG. 5 illustrates interval parameters as a function of an interval splitting variable in the present invention.

The Z-Coder avoids slow multiplications. The Z-Coder computes an approximation of the entropic test value using two line segments having constant slopes. Shown in FIG. 5, the first line segment has slope 1. It is used for small values of $P_{LPS}$. The second line segment has slope k and is used for large values of $P_{LPS}$.

This solution is implemented by computing Z(t) as the minimum of the two following quantities:

$$Z1(t)=A(t)+p \quad \text{(first line segment)}$$

$$Z2(t)=\tfrac{1}{2}+A(t)/2+k(p-\tfrac{1}{2}) \quad \text{(second line segment)}$$

where p is approximately equal to but slightly lower than $P_{LPS}$. The computation of Z1(t) involves only an addition, a computationally efficient operation. The computation of Z2(t) requires a multiplication but is subject to significant simplifications when k is a power of two:

when k=½, for instance, Z2(t) may be computed as ¼+Z1(t)/2.

when k=¼, for instance, Z2(t) may be computed as ⅜+[A(t)+Z1(t)]/4

Multiplication of binary numbers by values which are a power of two (¼, ½, 2, 4, 8, . . . ) requires only a data shift to be performed rather than a true multiplication. Thus, the simplified expressions can be computed quickly.

The decoding algorithm of FIG. 2 may be implemented in software code by the following subroutine:

boolean decoder (int p, boolean mps)

```
{
    z = a + p;                      // compute Z1(t)
    d = 0 x 6000 + (z + a) >> 2;    // compute Z2(t) (here with k = ¼)
    if (d < z)                      // compute Z(t) = min [Z1(t), Z2(t)]
        z = d;
    if (z > c)
        { a + = 0 x 10000 − z; c + = 0 x 10000 − z; bit = 1 − mps; }
    else
        { a = z; bit = mps)
    while (a > = 0 x 8000)
        { a = ((a − 0 x 8000) << 1);
          c = ((c − 0 x 8000) << 1) + next_code_bit(); }
    return bit;
}
```

The decoding method of FIG. 2 provides adaptive binary arithmetic decoding that achieves compression ratios that are much closer to entropic compression ratios than are achieved by arithmetic decoders of the prior art. The Z-Coder provides much better data compression than the prior art adaptive binary arithmetic decoders.

Figure 6:
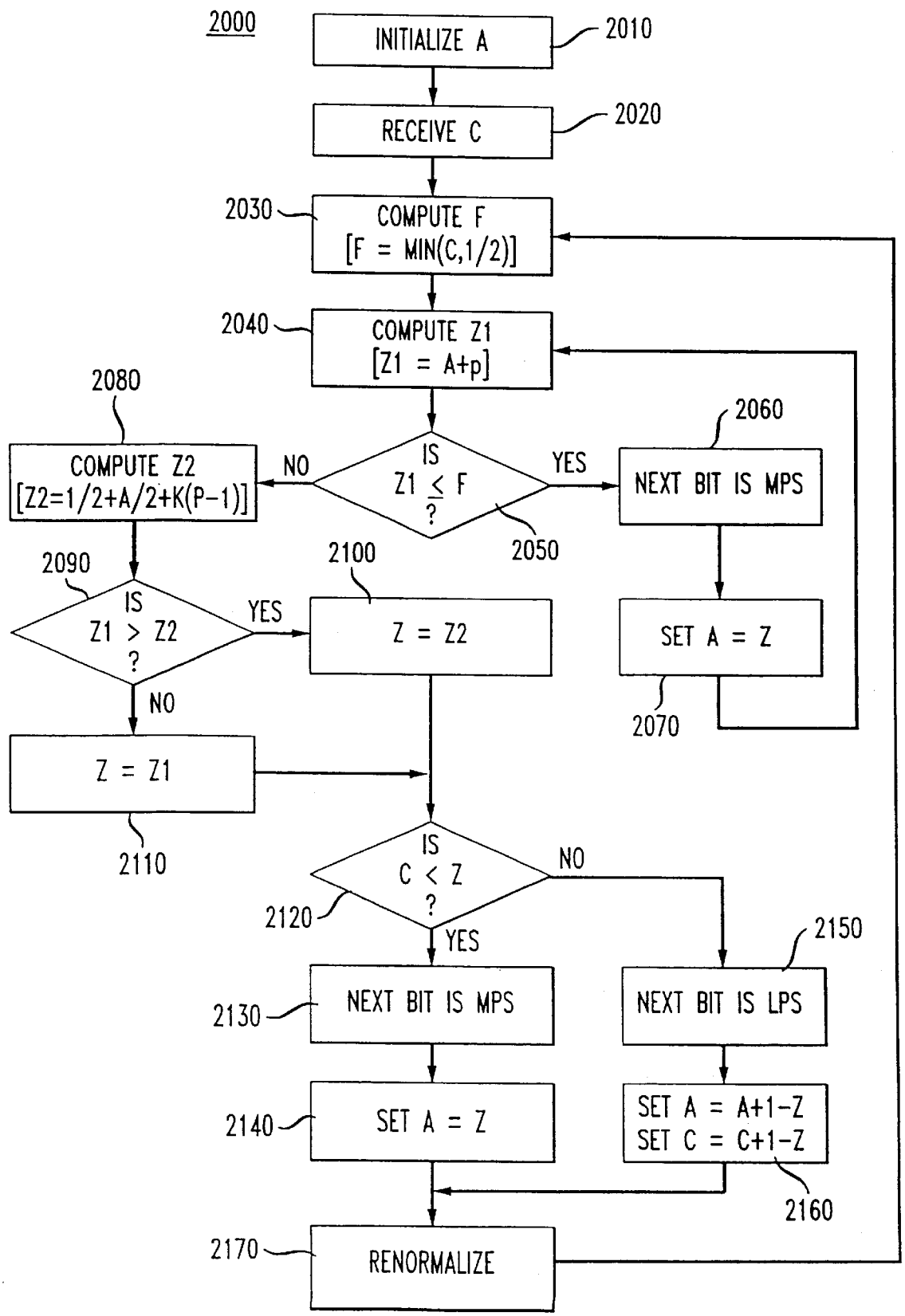
FIG. 6 illustrates a method of operation of a decoder according to a second embodiment of the present invention.

FIG. 6 illustrates a method of operation of a decoder according to a second embodiment of the present invention. The decoding method 2000 provides a fast decoding path for encoded MPS bits. Because the MPS is, by definition, the most probable symbol, the fast decoding path is traversed more often than other decoding paths. Fast decoding of the MPS, therefore, provides for improved performance.

The design of the fast decoder capitalizes upon the fact that an MPS may be returned as soon it is determined that Z1(t) is smaller than C(t) and also smaller than ½:

Z(t) is rarely greater than ½ because p is often very small;
Z(t) is rarely less than C(t) because PLPS is usually very small; and
Re-normalization rarely occurs because the compression ratio of the Z-Coder is very good (The decoding algorithm produces many more bits than it consumes).

The fast decoding method is initialized in the same manner as the traditional method of FIG. 2. A(1) is set to 0 (Step 2010). The decoder receives C(t) from the channel (Step 2020). The decoder computes a new "fence" variable, labeled F(t), to be the lesser of either C(t) or ½ (Step 2030). Further, the decoder computes Z1(t) as above (Step 2040).

The decoder compares Z1(t) against F(t) (Step 2050). If Z1(t) is less than F(t), the next bit to be decoded is an MPS. The decoder outputs the MPS as the next bit in the decoded data and sets A(t+1)=Z1(t) (Steps 2060–2070). Next, the decoder loops back to Step 2040.

If, at step 2050, Z1(t) is greater than F(t), the decoder computes Z2(t) and finally determines Z(t) to be the minimum of Z1(t) and Z2(t) (Steps 2080–2110).

The decoder determines whether Z(t) is greater than C(t) (Step 2120). If so, it decodes the next bit as an MPS and sets A(t+1)=Z(t) in a manner similar to steps 2060–2070 (Step 2130–2140). If, at step 2120, Z(t) is not greater than C(t), the decoder determines the next bit to be an LPS (Step 2150). It sets A(t1)=A(t)+1−Z(t) and sets C(t)=C(t)+1−Z(t) (Step 2160).

Thereafter, the decoder may perform re-normalization in a manner similar to the decoding method of FIG. 2 (Step 2170). After renormalization, the decoder loops back to step 2030 to compute a fence variable for the next decoded bit position (t=t+1).

The optimized decoder may be implemented in software using the following code:

```
boolean decoder_fast(int p, boolean mps)
{
    z = a + p;                    // Compute Z1(t)
    if (z < = fence)
        a = z; return mps}        //Fast path returns MPS immediately
    d = 0 x 6000 + (z + a) >> 2;  // Compute Z2(t) (here with k = ¼)
    if (d < z)                    // compute Z(t) = min[Z1(t),Z2(t)]
        z = d;
    if (z > c)
        a + = 0 x 10000 − z; c + = 0 x 10000 − z; bit = 1 − mps; }
    else
        { a = z; bit = mps; }
    while ( a > = 0 x 8000)
        { a = ((a − 0 x 8000) << 1);
          c = ((c − 0 x 8000) << 1) + next_code_bit(); }
    fence = c;
    if (fence > = 0 x 8000)
        { fence = 0 x 7FFF; }
    return bit;
}
```

As is shown, if Z1(t) is less than or equal to F(t), labeled "fence" in the software description, the decoder performs only a single step and then returns. The remainder of the decoding sub-routine is not performed. The fast decoder therefore provides improved decoding performance by minimizing decoding latency.

Figure 7:
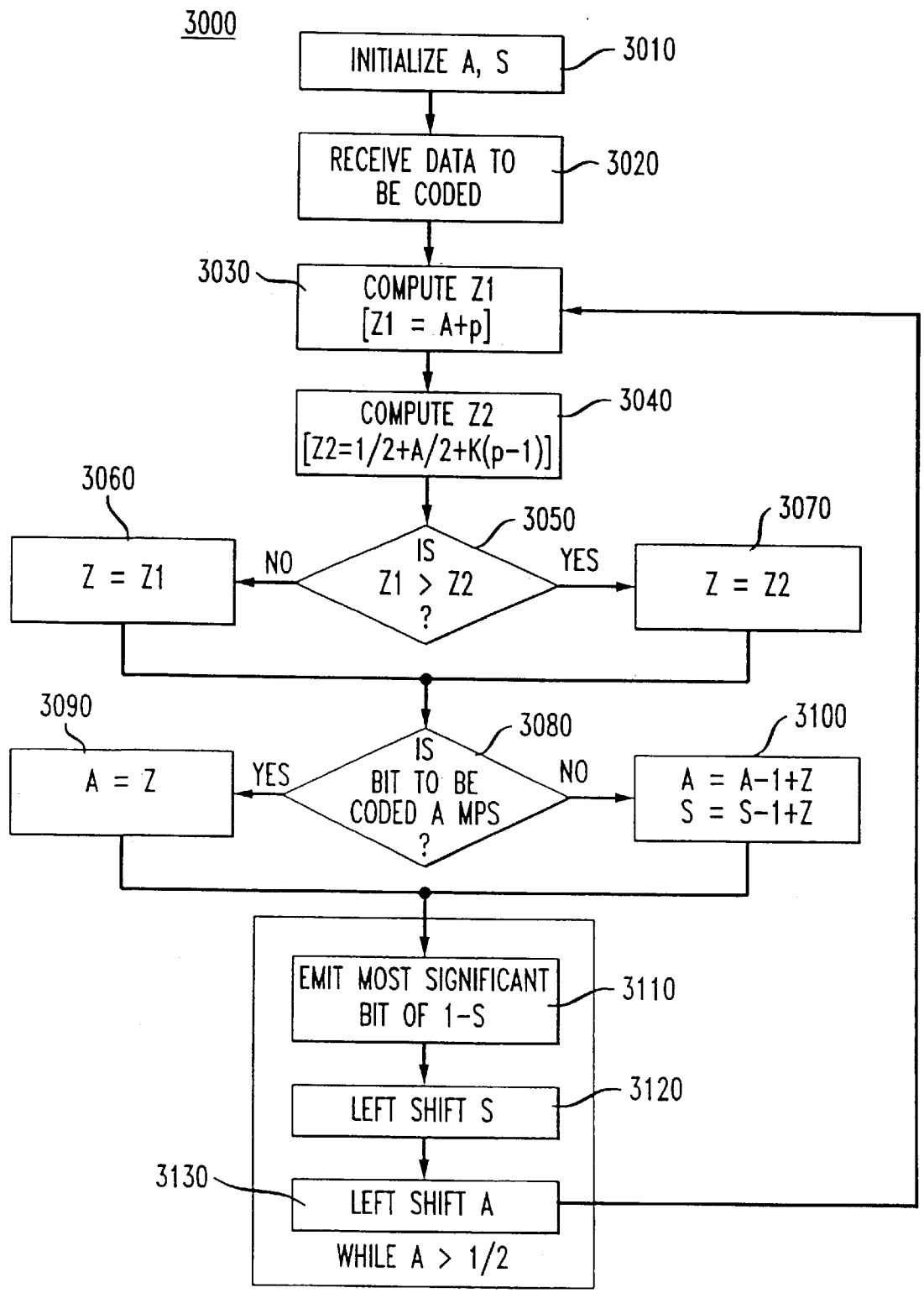
FIG. 7 illustrates a method of operation of an encoder according to an embodiment of the present invention.

The encoder performs data encoding using the same principles as the decoding methods described above. A method of operation of an encoder constructed in accordance with an embodiment of the present invention is illustrated in FIG. 7. The encoder maintains a code string interval of the form [A(t)−S(t),1−S(t)[. The interval can be interpreted as a lower bound A(t) on a number that plays the same role that C(t) does in the decoder. The code string is obtained by subtracting S(t) from the number. The quantity S(t) accumulates all the terms that are added to C(t) in the LPS branch of the decoder described above with regard to either FIGS. 2 or 6.

To encode a MPS, a new interval [Z(t)−S(t),1−S(t)] must be set. This is achieved by setting A(t)+1=Z(t). To encode an LPS, a new interval must be set to [A(t)−S(t), Z(t)−S(t)[ which is readily achieved by setting A(t+1)=A(t)+1−Z(t) and S(t+1)=S(t)+1−Z(t).

The encoding method is initialized by setting A(1) and S(1) to 0 (Step 3010). Data to be encoded is input to the encoder (Step 3020). Encoding of a symbol begins with the computation of test value Z(t) just as in the decoding methods (Steps 3030–3070).

The encoder examines a bit in the data stream to be coded (Step 3080). If the bit is an MPS, the encoder sets A(t+1)= Z(t) (Step 3090). If the bit is an LPS, the encoder sets A(t+1)=A(t)+1−Z(t) and S(t+1)=S(t)+1−Z(t) (Step 3100). These steps ensure that operation of the encoder and decoder track each other.

Coded data bits are emitted from the encoder only if A(t)≧½. While A(t)≧½, the decoder iteratively emits a bit of the code string (as the most significant bit of 1−S(t)) and shifts A(t) and S(t) a bit position to the left (Steps 3110–3130).

Thereafter, the encoder returns to step 3030 to decode another bit in the data string.

In a microprocessor or digital signal processor implementation, the encoder again stores values of A(t) and S(t) in data registers having fixed lengths. However, it should be appreciated that when an LPS is encoded, the shift S(t+1)=S(t)+1−Z(t) may cause a carry in the register storing the S value. The carry must be preserved. Accordingly, if a 16-bit register is used for example to store values of A(t), then S(t) must be stored in a 17-bit register.

Because the result of register S can overflow to a 17$^{th}$ bit, the subtraction in step 3120 can result in a negative number. S(t) can be greater than 1. The borrow must be propagated through previously emitted bits in C(t). The Z-Coder borrow propagation is similar to the carry propagation problem attendant in known binary arithmetic coders. The solutions obtained in the prior art apply equally well to the Z-Coder:

Bit counting consists of delaying issuance of the coded data string until a one is emitted or until a borrow propagation turns all the zeros into ones. This method may be implemented by keeping count of the number of zeros recently emitted.

Bit stuffing consists of inserting a dummy one when no lengths of sequence of zeros exceed the predefined limit. Bit stuffing may reduce the compression ratio but it sets an upper limit on the delay between encoding of a symbol and the emission of the corresponding code bits.

The encoding method of FIG. 6 may be implemented in software, employing the follow code:

```
void encoder(boolean bit, int p, boolean mps)
{
    z = a + p
    d = 0 x 6000 + (z + a) >> 2;   // compute Z2(t) (here with k = ¼)
    if (d < z)                      // compute Z(t) = min[Z1(t),Z2(t)]
        z = d;
    if (bit = = mps)
        (a = z; }
    else
        { s + = 0 x 100000 - z; a + = 0 x 100000 - z; }
    while (a > = 0 x 8000)
        { emit(1 - (s >> 15));
    s = (s&0 x 7fff) << 1; a + (a&0 x 7fff) << 1; }
}
```

The encoders and decoders of the Z-Coding system use an increment parameter p that represents the estimated probabilities of the LPS and MPS symbols. This section presents an analytic derivation of the relation between the symbol probability distribution $P_{LPS}$ and the optimal increment parameter p. This derivation relies on the analysis of a theoretical experiment that included a decoding a random string of independent equiprobable bits with a particular value of the increment p. The probability $P_{LPS}$ in the decoded symbol string can be calculated with the following simplifying assumptions:

A(t) contains a uniform random number in internal $[0,½[$. This uniform distribution hypothesis is reasonably supported by empirical evidence, as long as the greatest common divisor of the increment p and the interval size ½ is small.

C(t) contains a uniform random number in interval [A(t), 1[. This assumption is implied by the definition of the lower bound A(t) and by the random nature of the code string.

The assumptions also eliminate dependencies between consecutive decoded symbols. It is assumes that each bit is decoded with random values A(t) and C(t), regardless of previous decoding actions. Eliminating dependencies between consecutive symbols is surprisingly realistic. Real life applications tend to mix many streams of symbols with different probabilities into a single arithmetic coder. The interleaved mixture randomizes A(t) and C(t) quite efficiently.

Under these assumptions, the decoded symbols are independent identically distributed random variables. The probability of LPS can be derived using the following decomposition:

$$P^*(LPS)=P\{Z1(t)<Z2(t)\}P\{Z1(t)>C(t)|Z1(t)<Z2(t)\}+ P(Z1(t)>Z2(t))P\{Z2(t)>C(t)|Z1(t)>Z2(t)\}$$

Figure 8:
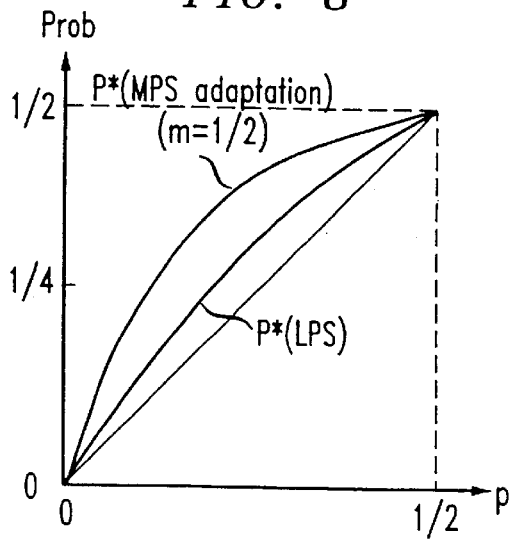
FIG. 8 is a graph illustrating a comparison between an optimal increment parameter and an increment parameter in use in an embodiment of the present invention.

Using this decomposition and the simplifying assumptions described above, a simple exercise in integral calculus provides analytical formulas relating P*(LPS) and p for each chosen value of the slope k (see, FIG. 8).

The case k=½, for instance, resolves to the following formula:

$$P^*(LPS)=p-(p+½) \log(p+½)-(p-½) \log½$$

Decoding a random sequence of independent equiprobable bits produces a random sequence of independent symbols distributed as derived above. Conversely, encoding such a random sequence of symbols, under the same assumptions, produces a random sequence of equiprobable bits. That means that the increment p is the optimal increment for symbol string distribution P*(LPS).

This formula has been confirmed by empirical experiments seeking the optimum increment for chosen symbol probability distributions. Encoding a random symbol string with this optimal increment produces about 0.5% more code bits than predicted by the information theoretical limit. This is probably the price of the additive approximation to the computation of the z-value.

This following discussion presents a stochastic algorithm that automatically adapts the Z-Coder parameters (p and MPS) while encoding or decoding symbol strings.

The adaptation algorithm must remember some information about-the observed symbol frequencies in the symbol string. It is convenient in practice to represent this information as a single integer state. Typical data compression applications maintain an array of state variables (also called "coding contexts"). Each symbol is encoded with a coding context chosen according to application specific prior information about its probability distribution.

The integer state is used as an index into a table defining the actual coder parameters, i.e., the identity of the MPS (zero or one) and the probability $P_{LPS}$ (a number in $[0,½]$). The Z-Coder adaptation algorithm modifies the value of the state variable when certain conditions are verified:

Encoding or decoding an LPS always triggers an LPS adaptation. The state variable is then changed to point a table entry with a larger value of the increment p, or, if the increment is already large, to point a table entry with swapped definition of the MPS and LPS symbols.

Encoding or decoding an MPS triggers an MPS adaptation if and only if A(t) is greater than a threshold m in $[½-p, ½[$ tabulated as a function of the current state. The state variable is changed to point a table entry with a smaller value of the increment p. In another embodiment encoding or decoding a MPS triggers a MPS adaptation if and only if Z(t), which is related to A(t) in a known way, is greater than a threshold tabulated as a function of the current state.

Figure 9:
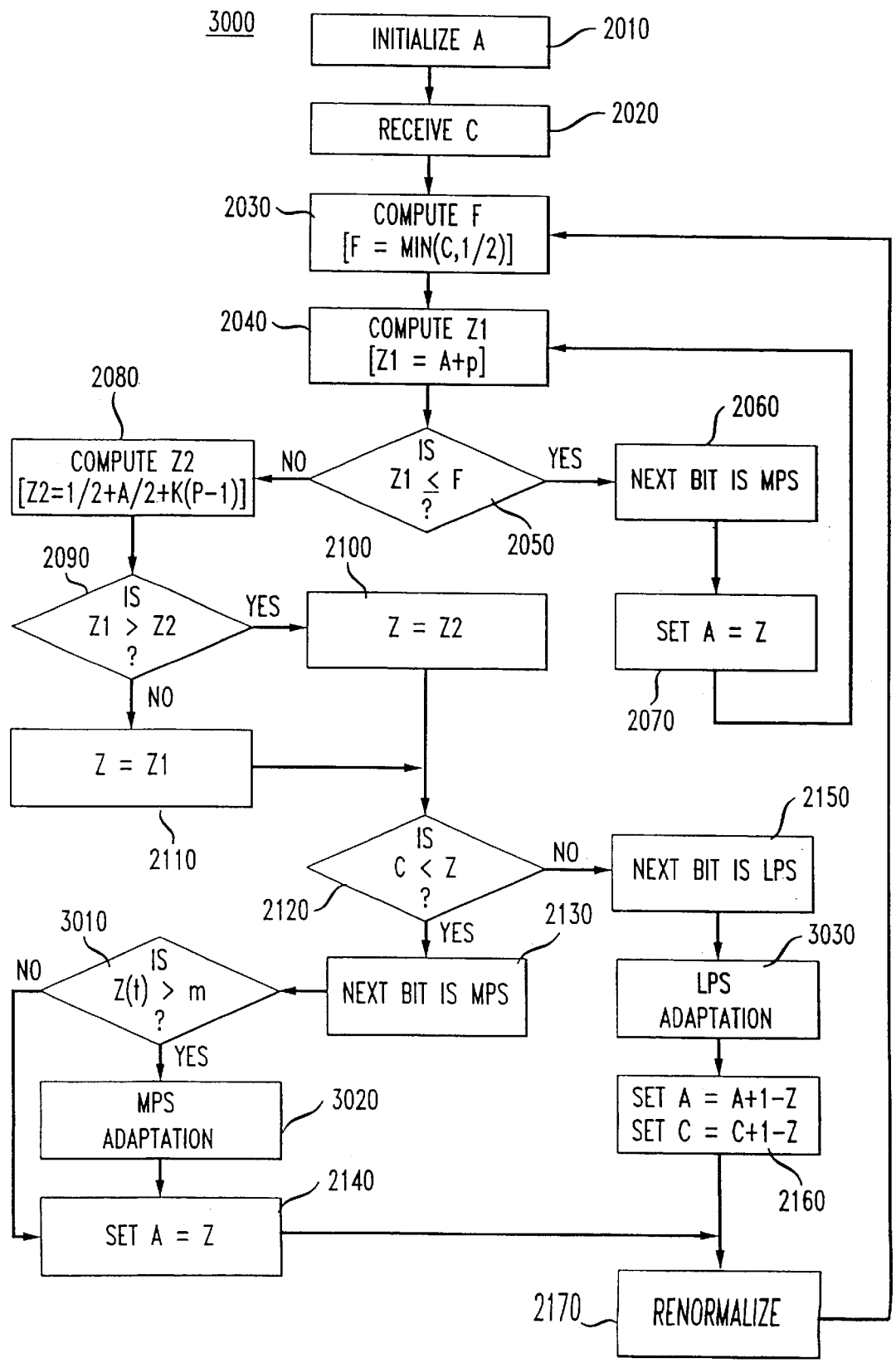
FIG. 9 illustrates a method of operation of a decoder according to a third embodiment of the present invention.

FIG. 9 illustrates a method of operation 3000 of a decoder that integrates adaptation with the fast decoding of FIG. 6. Like steps from FIG. 6 are indicated with like reference numerals. After step 2130, when the decoder determines that a next bit to be decoded is an MPS, the decoder tests for MPS adaptation. Specifically, the decoder determines whether A(t)>m, the threshold test variable for MPS adaptation (Step 3010). If so, the decoder performs the MPS adaptation (Step 3020). Thereafter, or if Z(t) fails the threshold of step 3010 (Z(t) ≯ m), the decoder resets A(t) for the next iteration (Step 2070). Equivalently, the decoder may test Z(t) against m.

At step 2150, when the decoder determines that the next bit to be decoded is an LPS, the decoder always performs LPS adaptation (Step 3030).

The remaining discussion pertains to symmetrical linear transition tables. These tables are organized like a ladder. The first rung represents the symbol distribution with the highest probability of zeroes. The last rung represents a symbol distribution with the highest distribution of ones. Each LPS transition moves the state variable on step towards the center of the ladder. Each MPS transition moves the state variable one step towards the closest tip of the ladder.

The limiting distribution of the state variable depends on the respective probabilities of the adaptation events. In the case of a symmetrical transition table, these probabilities must fulfill the following conditions:

P(MPS adaptation)<P(LPS adaptation) if p is too small
P(MPS adaptation)>P(LPS adaptation) if p is too large
P(MPS adaptation)=P(LPS adaptation) if p is optimal These conditions imply that the probability of both adaptation events must have the same order of magnitude. The Z-Coder adaptation algorithm uses Z(t) as a pseudo-random number generator to tune the probability of the MPS adaptation events.

Analytical expressions for the probabilities of the adaptation event are derived by assuming again that the lower bound register a contains a uniform random number in $[0, \frac{1}{2}[$. The following formulae are easily obtained by analyzing the encoding algorithm:

$$P(LPS \text{ adaptation}) = P(LPS) = P_{LPS}$$

$$P(MPS \text{ adaptation}) = P(A(t) > m | MPS) P(MPS) = (1-2m)(1-P_{LPS})$$

FIG. 8 compares the adaptation event probabilities as a function of the optimal increment p when the threshold m is equal to $\frac{1}{2}$. These curves show that this value of the threshold makes the probability of the MPS adaptation event too high. A larger threshold is needed to reduce the probability of MPS adaptation event until it becomes equal to the probability of LPS adaptation event.

For each value of the state variable, a threshold m is chosen in order to ensure that both adaptation events occur with the same probability when the increment p is optimal for the current value of $P_{LPS}$. The following expression gives the correct value of the threshold m as a function of the optimal increment p:

$$m = \frac{1}{2}(1 - P^*(LPS)/(1 - P^*(LPS)))$$

where P*(LPS) is the expression derived above.

The Z-Coder adaptation algorithm differs significantly from the adaptation scheme introduced by the Q-Coder and used by the QM-Coder. These coders perform a MPS adaptation whenever encoding or decoding a MPS produces or consumes a code bit. This is similar to using a constant threshold m=½ with the Z-Coder adaptation algorithm. An optimally tuned Q-Coder or QM-Coder therefore produces more MPS adaptation events than LPS adaptation events. This is compensated by a careful design of asymmetrical state transition tables.

The Z-Coder state transition tables however are free of these constraints. This can be a significant advantage for creating efficient state transition tables in an analytically principled way.

The encoder or decoder of the present invention may be provided on a processor or digital signal processor with appropriate program instructions.

As shown herein, the Z-Coder is an adaptive binary arithmetic coder having the following characteristics:

A new multiplication-free approximation of the interval splitting point provides an improved coding accuracy.

The decoder only keeps a lower bound on the code number, a simplification that leads to very fast implementation of the decoding algorithm.

The two registers used by both the encoding and the decoding algorithm require only sixteen bits and a carry bit, an implementation benefit that reduces the cost of implementation of the Z-Coder.

A new probability adaptation scheme reduces the constraints on state transition tables.

What is claimed is:

1. A method for decoding a coded string into a symbol string populated by more probable symbols (MPS) and less probable symbols (LPS), comprising:

interpreting the coded string as a binary fraction;

creating a coding interval defined by a variable lower bound value and 1;

calculating a test value;

dividing the coding interval into a lower subinterval and an upper subinterval, the lower subinterval extending from the lower bound value to the test value and the upper subinterval extending from the test value to 1;

placing an LPS into the symbol string and incrementing the lower bound value and coded string by a predetermined amount when the coded string lies within the lower subinterval, the predetermined amount being equal to the quantity 1 minus the test value; and placing an MPS into the symbol string and setting the lower bound value equal to the test value when the coded string lies within the upper subinterval.

2. The method of claim 1, wherein said calculating a test value further comprises:

calculating a first intermediate test value ($Z_1$) and a second intermediate test value ($Z_2$) derived from the lower bound value (A) and a current estimate (p) of the probability that an LPS will occur ($P_{LPS}$); and setting the test value (Z) equal to the lesser of the first ($Z_1$) and second ($Z_2$) intermediate test values.

3. The method of claim 2, wherein said intermediate test values $Z_1$ and $Z_2$ are computed according to:

$$Z_1 = A + p;$$

and $$Z_2 = \frac{1}{2} + A/2 + k(p - \frac{1}{2}),$$

wherein k is a power of 2.

4. The method of claim 3, wherein k=¼.

5. The method of claim 3, wherein p is approximately equal to but slightly less than $P_{LPS}$.

6. The method of claim 3, further comprising:

calculating a fence value to be the lesser of the code string or ½; and placing an MPS into the symbol string and setting the lower bound value equal to the test value if the first intermediate test value is less than the fence value.

7. The method of claim 1, further comprising:

re-normalizing the lower bound value and the coded string when the most significant bit positions of the lower bound value and the coded string are equal to 1; and consuming the most significant bit positions of the lower bound value and the coded string.

8. The method of claim 7, wherein the decoding is completed when all the bits in the coded string are consumed.

9. The method of claim 7, wherein said re-normalizing includes:

shifting the bits of the coded string one position to the left; and adding a new coded bit to the least significant bit position of the coded string.

10. The method of claim 1, further comprising performing MPS adaptation when an MPS is placed into the symbol string if the lower bound value is greater than a variable threshold test value.

11. The method of claim 10, wherein the variable threshold test value is derived from p.

12. The method of claim 1, further comprising performing LPS adaptation when an LPS is placed into the symbol string.

13. A method for encoding a symbol string populated by more probable symbols (MPS) and less probable symbols (LPS) into a coded string, comprising:
- calculating a test value;
- incrementing a variable lower bound value and an accumulator value by a predetermined amount when the symbol to be coded is an LPS, the predetermined amount being equal to the quantity 1 minus the test value;
- setting the lower bound value equal to the test value when the symbol to be coded is an MPS;
- calculating an accumulator difference value as the quantity 1 minus the accumulator value; and
- placing the most significant bit of the accumulator difference value into the coded string and shifting the bits of the lower bound value and the accumulator value one bit position to the left when the lower bound value is less than ½.

14. The method of claim 13, wherein said calculating a test value further comprises:
- calculating a first intermediate test value ($Z_1$) and a second intermediate test value ($Z_2$) derived from the lower bound value (A) and a current estimate (p) of the probability that an LPS will occur ($P_{LPS}$); and
- setting the test value (Z) equal to the lesser of the first ($Z_1$) and second ($Z_2$) intermediate test values.

15. The method of claim 14, wherein said intermediate test values $Z_1$ and $Z_2$ are computed according to:

$$Z_1 = A + p;$$

and $$Z_2 = \tfrac{1}{2} + A/2 + k(p - \tfrac{1}{2}),$$

wherein k is a power of 2.

16. The method of claim 15, wherein k=¼.

17. The method of claim 15, wherein p is approximately equal to but slightly less than $P_{LPS}$.

18. The method of claim 13, wherein the encoding is completed when all the symbols in the symbol string are encoded.

19. An apparatus for decoding a coded string into a symbol string populated by more probable symbols (MPS) and less probable symbols (LPS), comprising a processor adapted to:
- interpret a coded string as a binary fraction;
- create a coding interval defined by a variable lower bound value and 1;
- calculate a test value;
- divide the coding interval into a lower subinterval and an upper subinterval, the lower subinterval extending from the lower bound value to the test value and the upper subinterval extending from the test value to 1;
- place an LPS into the symbol string and increment the lower bound value and coded string by a predetermined amount when the coded string lies within the lower subinterval, the predetermined amount being equal to the quantity 1 minus the test value; and
- place an MPS into the symbol string and set the lower bound value equal to the test value when the coded string lies within the upper subinterval.

20. The apparatus of claim 19, wherein said processor is further adapted to:
- calculate a first intermediate test value ($Z_1$) and a second intermediate test value ($Z_2$) derived from the lower bound value (A) and a current estimate (p) of the probability that an LPS will occur ($P_{LPS}$); and
- set the test value (Z) equal to the lesser of the first ($Z_1$) and second ($Z_2$) intermediate test values.

21. The apparatus of claim 20, wherein $Z_1$ and $Z_2$ are computed according to:

$$Z_1 = A + p;$$

and $$Z_2 = \tfrac{1}{2} + A/2 + k(p - \tfrac{1}{2}),$$

wherein k is a power of 2.

22. The apparatus of claim 21, wherein k=¼.

23. The apparatus of claim 21, wherein said processor is further adapted to:
- calculate a fence value to be the lesser of the code string or ½; and
- place an MPS into the symbol string and set the lower bound value equal to the test value if the first intermediate test value is less than the fence value.

24. The apparatus of claim 19, wherein said processor is further adapted to:
- re-normalize the lower bound value and the coded string when the most significant bit positions of the lower bound value and the coded string are equal to 1; and
- consume the most significant bit positions of the lower bound value and the coded string.

25. The apparatus of claim 24, wherein the decoding is completed when all the bits in the coded string are consumed.

26. The apparatus of claim 24, wherein said processor is further adapted to:
- shift the bits of the coded string one position to the left; and
- add a new coded bit to the least significant bit position of the coded string.

27. The apparatus of claim 19, wherein said processor is further adapted to perform LPS adaptation when an LPS is placed into the symbol string.

28. The apparatus of claim 17, wherein said processor is further adapted to perform MPS adaptation when an MPS is placed into the symbol string if the lower bound value is greater than a variable threshold test variable.

29. An apparatus for encoding a symbol string populated by more probable symbols (MPS) and less probable symbols (LPS) into a coded string, comprising a processor adapted to:
- calculate a test value;
- increment the lower bound value and the accumulator value by a predetermined amount when the symbol to be coded is an LPS, the predetermined amount being equal to the quantity 1 minus the test value;
- set the lower bound value equal to the test value when the symbol to be coded is an MPS;
- calculate an accumulator difference value as the quantity 1 minus the accumulator value; and
- place the most significant bit of the accumulator difference value into the coded string and shift the bits of the lower bound value and the accumulator value one bit position to the left when the lower bound value is less than ½.

30. The apparatus of claim 29, wherein said processor is further adapted to:
   calculate a first intermediate test value ($Z_1$) and a second intermediate test value ($Z_2$) derived from the lower bound value (A) and a current estimate (p) of the probability that an LPS will occur ($P_{LPS}$); and
   set the test value (Z) equal to the lesser of the first ($Z_1$) and second ($Z_2$) intermediate test values.

31. The apparatus of claim 30, wherein $Z_1$ and $Z_2$ are computed according to:

$$Z_1 = A + p;$$

and $$Z_2 = \tfrac{1}{2} + A/2 + k(p - \tfrac{1}{2}),$$

wherein k is a power of 2.

32. The apparatus of claim 31, wherein k=¼.

33. The apparatus of claim 29, wherein the encoding is completed when all the symbols in the symbol string are encoded.

34. An encoded data signal representing a symbol string populated by more probable symbols (MPS) and less probable symbols (LPS) generated according to the process of:
   calculating a test value;
   incrementing a variable lower bound value and an accumulator value by a predetermined amount when the symbol to be coded is an LPS, the predetermined amount being equal to the quantity 1 minus the test value;
   setting the lower bound value equal to the test value when the symbol to be coded is an MPS;
   calculating an accumulator difference value as the quantity 1 minus the accumulator value; and
   placing the most significant bit of the accumulator difference value into the coded string and shifting the bits of the lower bound value and the accumulator value one bit position to the left when the lower bound value is less than ½.

35. The data signal of claim 34, wherein said calculating a test value further comprises:
   calculating a first intermediate test value ($Z_1$) and a second intermediate test value ($Z_2$) derived from the lower bound value (A) and a current estimate (p) of the probability that an LPS will occur ($P_{LPS}$); and
   setting the test value (Z) equal to the lesser of the first ($Z_1$) and second ($Z_2$) intermediate test values.

36. The data signal of claim 35, wherein said intermediate test values $Z_1$ and $Z_2$ are computed according to:

$$Z_1 = A + p;$$

and $$Z_2 = \tfrac{1}{2} + A/2 + k(p - \tfrac{1}{2}),$$

wherein k is a power of 2.

37. The data signal of claim 36, wherein k=¼.

38. The data signal of claim 36, wherein p is approximately equal to but slightly less than $P_{LPS}$.

39. A computer-readable medium having stored thereon a plurality of instructions for decoding a coded string into a symbol string populated by more probable symbols (MPS) and less probable symbols (LPS), which, when executed by a processor, cause the processor to:
   interpret a coded string as a binary fraction;
   create a coding interval defined by a variable lower bound value and 1;
   calculate a test value;
   divide the coding interval into a lower subinterval and an upper subinterval, the lower subinterval extending from the lower bound value to the test value and the upper subinterval extending from the test value to 1;
   place an LPS into the symbol string and increment the lower bound value and coded string by a predetermined amount when the coded string lies within the lower subinterval, the predetermined amount being equal to the quantity 1 minus the test value; and
   place an MPS into the symbol string and set the lower bound value equal to the test value when the coded string lies within the upper subinterval.

40. The computer readable medium of claim 39, further comprising instructions that cause the processor to:
   calculate a first intermediate test value ($Z_1$) and a second intermediate test value ($Z_2$) derived from the lower bound value (A) and a current estimate (p) of the probability that an LPS will occur ($P_{LPS}$); and
   set the test value (Z) equal to the lesser of the first ($Z_1$) and second ($Z_2$) intermediate test values.

41. The computer readable medium of claim 40, wherein $Z_1$ and $Z_2$ are computed according to:

$$Z_1 = A + p;$$

and $$Z_2 = \tfrac{1}{2} + A/2 + k(p - \tfrac{1}{2}),$$

wherein k is a power of 2.

42. The computer readable medium of claim 41, wherein k=¼.

43. The computer readable medium of claim 39, further comprising instructions that cause the processor to:
   re-normalize the lower bound value and the coded string when the most significant bit positions of the lower bound value and the coded string are equal to 1; and
   consume the most significant bit positions of the lower bound value and the coded string.

44. The computer readable medium of claim 43, wherein the decoding is completed when all the bits in the coded string are consumed.

45. The computer readable medium of claim 43, further comprising instructions that cause the processor to:
   shift the bits of the coded string one position to the left; and
   add a new coded bit to the least significant bit position of the coded string.

46. The computer readable medium of claim 39, further comprising instructions that cause the processor to:
   calculate a fence value to be the lesser of the code string or ½; and
   place an MPS into the symbol string and set the lower bound value equal to the test value if the first intermediate test value is less than the fence value.

47. The computer readable medium of claim 39, further comprising instructions that cause the processor to perform LPS adaptation when an LPS is placed into the symbol string.

48. The computer readable medium of claim 39, further comprising instructions that cause the processor to perform MPS adaptation when an MPS is placed into the symbol string if the lower bound value is greater than a variable threshold test value.

49. A computer-readable medium having stored thereon a plurality of instructions for encoding a symbol string populated by more probable symbols (MPS) and less probable symbols (LPS) into a coded string, which, when executed by a processor, cause the processor to:

calculate a test value;

increment the lower bound value and the accumulator value by a predetermined amount when the symbol to be coded is an LPS, the predetermined amount being equal to the quantity 1 minus the test value;

set the lower bound value equal to the test value when the symbol to be coded is an MPS;

calculate an accumulator difference value as the quantity 1 minus the accumulator value; and place the most significant bit of the accumulator difference value into the coded string and shift the bits of the lower bound value and the accumulator value one bit position to the left when the lower bound value is less than ½.

50. The computer readable medium of claim 49, further comprising instructions that cause the processor to:

calculate a first intermediate test value ($Z_1$) and a second intermediate test value ($Z_2$) derived from the lower bound value (A) and a current estimate (p) of the probability that an LPS will occur ($P_{LPS}$); and set the test value (Z) equal to the lesser of the first ($Z_1$) and second ($Z_2$) intermediate test values.

51. The computer readable medium of claim 50, wherein $Z_1$ and $Z_2$ are computed according to:

$$Z_1 = A + p;$$

and $$Z_2 = \frac{1}{2} + A/2 + k(p - \frac{1}{2}),$$

wherein k is a power of 2.

52. The computer readable medium of claim 51, wherein $k = \frac{1}{4}$.

* * * * *